US010369656B2

United States Patent
Takigawa et al.

(10) Patent No.: US 10,369,656 B2
(45) Date of Patent: Aug. 6, 2019

(54) PROCESS FOR PRODUCING SPUTTERING TARGET AND SPUTTERING TARGET

(71) Applicant: SUMITOMO CHEMICAL COMPANY, LIMITED, Tokyo (JP)

(72) Inventors: Mikio Takigawa, Niihama (JP); Toshiyuki Terasawa, Tokyo (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/770,857

(22) PCT Filed: Jul. 10, 2017

(86) PCT No.: PCT/JP2017/025145
§ 371 (c)(1),
(2) Date: Apr. 25, 2018

(87) PCT Pub. No.: WO2018/012461
PCT Pub. Date: Jan. 18, 2018

(65) Prior Publication Data
US 2018/0304400 A1    Oct. 25, 2018

(30) Foreign Application Priority Data
Jul. 13, 2016    (JP) ................... 2016-138711

(51) Int. Cl.
*B23K 20/02*    (2006.01)
*C23C 14/34*    (2006.01)

(52) U.S. Cl.
CPC ............ *B23K 20/023* (2013.01); *C23C 14/34* (2013.01); *C23C 14/3407* (2013.01)

(58) Field of Classification Search
CPC .... C23C 14/34; C23C 14/3407; B23K 20/023
See application file for complete search history.

(56) References Cited

U.S. PATENT DOCUMENTS 5,693,203 A * 12/1997 Ohhashi .............. C23C 14/3407
204/298.12
5,836,506 A    11/1998 Hunt et al.
(Continued)

FOREIGN PATENT DOCUMENTS

JP    9-143707 A    6/1997
JP    2001-262330 A    9/2001
(Continued)

OTHER PUBLICATIONS

Decision to Grant a Patent (including an English translation thereof) issued in the Japanese Patent Application No. 2017-134085 dated Dec. 19, 2017.

(Continued)

*Primary Examiner* — John J Brayton
(74) *Attorney, Agent, or Firm* — Birch, Stewart, Kolasch & Birch, LLP

(57) ABSTRACT

A process for producing a sputtering target in which a target material is diffusion-bonded to a top face of a backing plate material, the process comprising:
a step of heating the top face of the target material by a hot plate while pressing from above thereby diffusion-bonding the target material to the backing plate material in such a manner that the step is performed at a center part prior to an outer peripheral part of the top face.

10 Claims, 7 Drawing Sheets

(56) References Cited

U.S. PATENT DOCUMENTS

| | | | |
|---|---|---|---|
| 6,073,830 A | 6/2000 | Hunt et al. | |
| 6,283,357 B1* | 9/2001 | Kulkarni | C23C 14/3407 204/298.12 |
| 6,521,108 B1 | 2/2003 | Zhang | |
| 6,698,647 B1 | 3/2004 | Kim | |
| 6,840,431 B1 | 1/2005 | Kim | |
| 2002/0185372 A1 | 12/2002 | Hunt et al. | |
| 2005/0051606 A1* | 3/2005 | Perrot | B23K 20/023 228/193 |
| 2007/0166554 A1* | 7/2007 | Ruchert | H01L 23/3735 428/446 |
| 2009/0045051 A1* | 2/2009 | Ferrasse | C23C 14/3407 204/298.13 |
| 2012/0255859 A1 | 10/2012 | Tsukamoto | |

FOREIGN PATENT DOCUMENTS

| | | |
|---|---|---|
| JP | 2001-303245 A | 10/2001 |
| JP | 2001-316810 A | 11/2001 |
| JP | 2002-69628 A | 3/2002 |
| JP | 2007-505217 A | 3/2007 |
| JP | 2008-138274 A | 6/2008 |
| JP | 4560170 B2 | 10/2010 |
| JP | 2018-16883 A | 2/2018 |
| WO | WO 2011/078148 A1 | 6/2011 |

OTHER PUBLICATIONS

Decision to Grant a Patent (including an English translation thereof) issued in the Japanese Patent Application No. 2018-004026 dated May 8, 2018.

Machine translation of JP-2001-303245-A, published on Oct. 31, 2001.

Machine translation of JP-2001-316810-A, published on Nov. 16, 2001.

Machine translation of JP-2002-69628-A, published on Mar. 8, 2002.

Notification of Reasons for Refusal (including an English translation thereof) issued in the Japanese Patent Application No. 2017-134085 dated Aug. 22, 2017.

International Search Report, issued in PCT/JP2017/025145, dated Sep. 19, 2017.

\* cited by examiner

FIG. 14

|   | A    | B    | C    | D    | E    |
|---|------|------|------|------|------|
| 1 | +0.0 | +0.1 | +0.2 | +0.1 | +0.0 |
| 2 | +0.1 | +0.2 | +0.3 | +0.2 | +0.1 |
| 3 | +0.2 | +0.3 | +0.4 | +0.3 | +0.2 |
| 4 | +0.1 | +0.2 | +0.3 | +0.2 | +0.1 |
| 5 | +0.0 | +0.1 | +0.2 | +0.1 | +0.0 |

PROCESS FOR PRODUCING SPUTTERING TARGET AND SPUTTERING TARGET

TECHNICAL FIELD

The present invention relates to a process for producing a sputtering target and a sputtering target.

BACKGROUND ART

Conventionally, as a process for producing a sputtering target, there is a process mentioned in JP 09-143707 A (Patent Document 1). In this process for producing a sputtering target, hot isostatic pressing capable of applying isotropic pressing (hot isotropic pressing process: hot isostatic press (HIP)) is applied to thereby diffusion-bond a target material to a backing plate material, thus producing a sputtering target.

PRIOR ART DOCUMENT

Patent Document

Patent Document 1: JP09-143707A1

DISCLOSURE OF THE INVENTION

Problems to be Solved by the Invention

It is an object of the present invention to provide a process for producing a sputtering target that can increase a bonding strength of a target material to a backing plate material (particularly, in a center part of the target material).

Means for Solving the Problems

To solve the above problem, the process for producing a sputtering target of the present invention is a process for producing a sputtering target in which a target material is diffusion-bonded to a top face of a backing plate material, which process includes heating a top face of the target material by a hot plate at a center part of the face prior to an outer peripheral part of the face while pressing from above to perform diffusion-bonding the target material to the backing plate material.

As used herein, the hot plate placed on the target material side during pressing is sometimes referred to as "upper hot plate", and the hot plate placed on the backing plate material during pressing is sometimes referred to as "lower hot plate". The diffusion bonding can be performed using a hot press as mentioned later.

According to the process for producing a sputtering target of the present invention, the top face of the target material is heated by the hot plate at a center part of the face prior to an outer peripheral part of the face while pressing in the uniaxial direction to perform diffusion-bonding the target material to the backing plate material. The process makes it possible to apply a load to the top face of the target material at least the center part of the face by the hot plate and to increase the bonding strength of the center part of the target material to the backing plate material.

According to the process of the present invention, the top face of the target material can be loaded by the hot plate in order from the center part to the outer peripheral part, thereby making it possible to remove air existing between the top face of the backing plate material and a bottom face of the target material from the center part to the outer peripheral part. Therefore, a gap can be eliminated between the top face of the backing plate material and the bottom face of the target material, and the bonding strength of the target material to the backing plate material can be increased.

According to the process of the present invention, owing to use of the hot press, reducing the pressure required for bonding, shortening the time required for bonding and reducing the cost required for bonding can be achieved, as compared with a hot isotropic pressing process.

In an embodiment of the process for producing a sputtering target, the center part of the top face of the target material projects upward from the outer peripheral part of the top face of the target material.

According to the embodiment, the center part of the top face of the target material projects upward from the outer peripheral part of the top face of the target material so that, with a simple procedure, the top face of the target material can be pressed by the hot plate at the center part of the face prior to the outer peripheral part of the face during boning.

According to an embodiment of the process for producing a sputtering target, in the hot plate, a center part of a press surface projects downward from an outer peripheral part of the press surface.

According to the embodiment, in the hot plate, the center part of the press surface projects downward from the outer peripheral part of the press surface so that, with a simple procedure, the top face of the target material can be pressed at the center part of the face prior to the outer peripheral part of the face by the hot plate during bonding.

As used herein, the press surface means a surface in contact with the target material during pressing. Hereinafter, the press surface is sometimes referred to as "bottom face of the hot plate".

As used herein, the "top face of the target material" means a face of the target material, which is a face opposite to a face in contact with the backing plate material during pressing.

In an embodiment of the process for producing a sputtering target, the top face of the target material has a center part provided with a projecting member projecting upward from the outer peripheral part of the top face.

According to the embodiment, the top face of the target material has a center part provided with the projecting member projecting upward from the outer peripheral part of the top face so that, with a simple procedure, the top face of the target material can be pressed at the center part prior to the outer peripheral part of the top face by the hot press during bonding.

In an embodiment of the process for producing a sputtering target, the target material is incorporated inside a frame part of a backing plate material having an annular frame part, and the top face of the target material is heated by the hot plate at the center part of the face prior to the outer peripheral part of the top face while pressing from above.

According to the embodiment, the target material is incorporated inside the frame part of the backing plate material and the top face of the target material is heated by the hot plate at the center part of the face prior to the outer peripheral part of the top face while pressing from above. This embodiment makes it possible to apply a load to the top face of the target material at the center part of the top face by the hot plate so that bonding strength of the target material to the backing plate material can be increased, even when the target material is incorporated inside the frame part of the backing plate material.

In an embodiment, a sputtering target includes:
a backing plate material; and
a target material bonded to a top face of the backing plate material;
wherein a bonding strength between a center part of the target material and the backing plate material is 7 kg/mm$^2$ or more.

In an embodiment, a bonded body for producing a sputtering target, includes:
a backing plate material; and
a target material bonded to a top face of the backing plate material;
wherein a bonding strength between a center part of the target material and the backing plate material is 7 kg/mm$^2$ or more.

According to the embodiment, the bonding strength between the center part of the target material and the backing plate material is 7 kg/mm$^2$ or more so that the bonding strength of the target material to the backing plate material can be increased.

Herein, the bonding strength between the center part of the target material and the backing plate material means, for example, the strength of a bonding part with the backing plate material in a region where the top face of the target material is projected, at the center part to be initially pressed by a bottom face of the hot plate, against a bottom face of the target material when the top face of the target material is pressed at the center part of the face by the bottom face of the hot plate.

Effects of the Invention

According to the process for producing a sputtering target of the present invention, the top face of the target material is heated at the center part of the face prior to the outer peripheral part of the face by the press surface of the hot plate while pressing from above to perform diffusion-bonding of the target material to the backing plate material. The process makes it possible to increase the bonding strength of the target material to the backing plate material (particularly, in the center part of the target material).

BRIEF DESCRIPTION OF THE DRAWINGS

FIG. 14 It is an explanatory view showing a position coordinate of a bottom face (press surface) of an upper hot plate and a dimension of the position coordinate.

MODE FOR CARRYING OUT THE INVENTION

Figure 1:
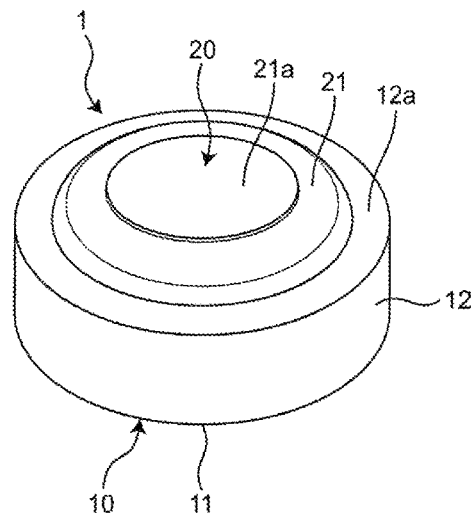
FIG. 1 It is a perspective view showing a first embodiment of a sputtering target of the present invention.
Figure 2:
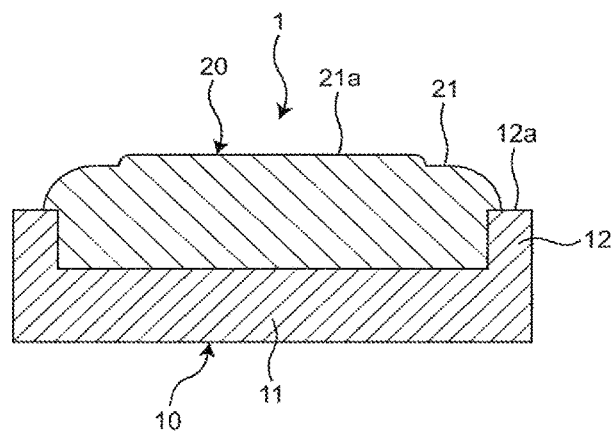
FIG. 2 It is a cross-sectional view of a sputtering target of a first embodiment.

The present invention will be described in detail below with reference to the embodiments shown in the drawings.
(First Embodiment)
FIG. 1 is a perspective view showing a first embodiment of a sputtering target of the present invention. FIG. 2 is a cross-sectional view of a sputtering target. As shown in FIG. 1 and FIG. 2, a sputtering target 1 includes a backing plate material 10 and a target material 20 bonded to a top face of the backing plate material 10. The backing plate material 10 includes a base plate 11 and an annular frame part 12 provided along an outer periphery of the top face of the base plate 11. The target material 20 is fit inside the frame part 12 of the backing plate material 10 and is diffusion-bonded to the top face of the base plate 11. A height direction of the frame part 12 is a vertical direction, a side of the base plate 11 is a bottom side, and a side opposite to the base plate 11 is a top side. The backing plate material 10 and the target material 20 are formed into a circular shape when viewed from above. The backing plate material 10 and the target material 20 may be formed into an oval shape, an ellipse shape, a polygonal shape, or the like.

The top face 21 of the target material 20 includes a sputtering face for receiving an inert gas being plasmatized (or being ionized) during sputtering. Target atoms contained in the target material 20 are sputtered out from the sputtering face with which the inert gas is collided. The sputtered atoms are accumulated on a substrate arranged facing to the sputtering face to form a thin film on the substrate.

A center part of the top face 21 of the target material 20 projects upward from an outer peripheral part of the top face 21 of the target material 20. The center part of the top face 21 includes a circular projecting part 21a projecting upwardly. The uppermost position of the target material 20 is higher than the uppermost position of the frame part 12 of the backing plate material 10 in a height direction of the frame part 12 of the backing plate material 10. In other words, the top face 21 of the target material 20 projects upward from a top face 12a of the frame part 12 of the backing plate material 10.

The target material 20 can be produced from a material selected from the group consisting of metals such as aluminum (Al), copper (Cu), chrome (Cr), iron (Fe), tantalum (Ta), titanium (Ti), zirconium (Zr), tungsten (W), molybdenum (Mo), niobium (Nb), etc. and alloys thereof, but the material constituting the target material 20 is not limited thereto. The material of the target material 20 is preferably a material which has hardness smaller than that of the backing plate material and is easily deformed during diffusion bonding. Specifically, the material is preferably Al or an Al alloy, and more preferably Al, and it is particularly preferred to use Al in which a base material, except for additive elements, has Al purity of 99.99% or more, more preferably 99.999% or more, and still more preferably 99.9999% or more. When the purity of Al increases, the hardness of the base material (target material) decreases, leading to deformation due to pressing so that the bondability with the backing plate material can further be enhanced.

When Al is used as the target material, from the viewpoint of alloy spikes, electromigration, etc., Si, Cu, Nd, Mg, Fe, Ti, Mo, Ta, Nb, W, Ni, Co, and the like (preferably, Si, Cu, etc.) may be added as an additive element. Preferably, an Al—Cu alloy (e.g., Al-1.0% Cu, Al-0.5% Cu, etc.), an Al—Si alloy (e.g., Al-1.0% Si, Al-0.5% Si, etc.), and an Al—Cu—Si alloy (e.g., Al-1.0% Si-0.5% Cu, etc.) are used. Al having Vickers hardness of 50 or less, preferably 45 or less, and more preferably 40 or less are used.

The material of the backing plate material 10 may be the same as that of the target material 20. Preferably, the material of the backing plate material 10 is a material selected from one or more of aluminum (Al), copper (Cu), titanium (Ti), tungsten (W), molybdenum (Mo), tantalum (Ta), niobium (Nb), iron (Fe), and alloys thereof, and more preferably a material selected from one or more of aluminum (Al), copper (Cu), and alloys thereof. Preferably, the hardness of the backing plate material 10 is larger than the hardness of the target material 20. When the target material 20 is Al or an Al alloy, an A2024 alloy, purified Cu, a Cu—Cr alloy, SUS304, an A5052 alloy, an A5083 alloy, an A6061 alloy, an A7075 alloy, and the like can preferably be used. Deformation of the backing plate material can be suppressed by adjusting the Vickers hardness to more than 50, preferably 100 or more, more preferably 110 or more, and still more preferably 130 or more.

A diameter of the backing plate material 10 is, for example, 250 mm to 850 mm, preferably 300 mm to 650 mm, and more preferably 350 mm to 550 mm, and a diameter of the target material 20 is, for example, 200 mm to 700 mm, preferably 250 mm to 600 mm, and more preferably 300 mm to 500 mm, which are suitable as the backing plate material 10 and the target material 20 to be used for diffusion bonding. The diameter of the backing plate material 10 and the diameter of the target material 20 are not limited thereto but, from the viewpoint of work efficiency, the inside diameter of the frame material 12 of the backing plate material 10, to which the target material 20 is incorporated, is preferably made larger than the diameter of the target material 20 to be incorporated. When a distance between an outer periphery of the target material 20 and an inner periphery of the frame material 12 of the backing plate material 10 is too large, the degree of deformation of the target material 20 generating in a direction other than a pressuring direction increases, thus failing to obtain sufficient bonding strength or leading to a change in crystallinity of the target material 20 easily. Therefore, the diameter of the inner periphery of the frame material 12 of the backing plate material 10 is made larger than the target material 20 to be incorporated by 0.1 mm to 10 mm, preferably 0.2 mm to 5 mm, and more preferably 0.3 mm to 1 mm.

Figure 3:
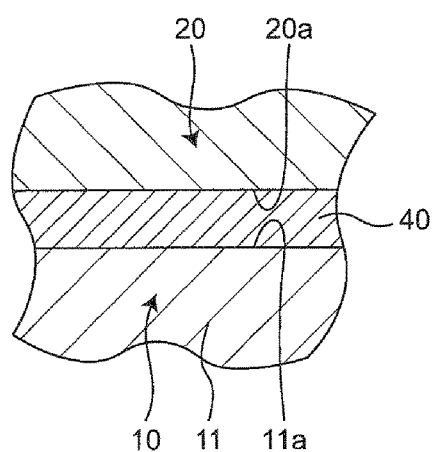
FIG. 3 It is an enlarged cross-sectional view of a sputtering target of a first embodiment.

FIG. 3 is an enlarged view of FIG. 2. As shown in FIG. 3, a plating layer 40 can be provided between the backing plate material 10 and the target material 20. The plating layer 40 thus provided enables enhancement of bonding between the backing plate material 10 and the target material 20. More specifically, the plating layer 40 is provided at least between a top face 11a of the base plate 11 and a bottom face 20a of the target material 20. The material of the plating layer 40 is silver, and may be metal such as chrome, zinc, copper, or nickel. The plating layer 40 is formed in advance on at least one of the backing plate material 10 and target material 20 by a general plating process such as electrolytic plating or electroless plating. When producing a large amount of sputtering target, it is generally preferred to use an electrolytic plating process with high plating rate (as described in JPS58-55237A2, JP2010-222617A1, and JP2009-149965A1). When the plating layer 40 is provided on the surface of the backing plate material 10 the target material 20, the surface may be provided with a layer of metal such as copper or zinc, as an underlying layer, by plating, followed by formation of a silver layer on the copper layer or the zinc layer by plating. At this time, the plating layer 40 includes a layer of metal such as copper or zinc, in addition to the silver layer. As mentioned above, the plating layer 40 may be a single layer or multiple layers. A thickness of the plating layer 40 is usually from 5 μm to 200 μm, preferably from 10 μm to 100 μm, more preferably from 20 μm to 50 μm, and still more preferably from 25 μm to 40 μm. When the thickness of the plating layer is in the above range, bonding strength can maintain sufficient to suppress defective bonding such as occurrence of the unbonded portion.

FIG. 2 shows a sputtering target 1. The sputtering target 1 of FIG. 2 may be a bonded body for producing a sputtering target. Thereafter, the frame part 12 of the backing plate material 10 and the top face 21 of the target material 20 of the bonded body for producing a sputtering target may be shaved off by machining using a milling machine, an NC milling machine, a machining center, a lathe, an NC lathe, and the like, to obtain a sputtering target finished into a desired size and surface state.

A process for producing a sputtering target 1 will be described below.

Figure 4:
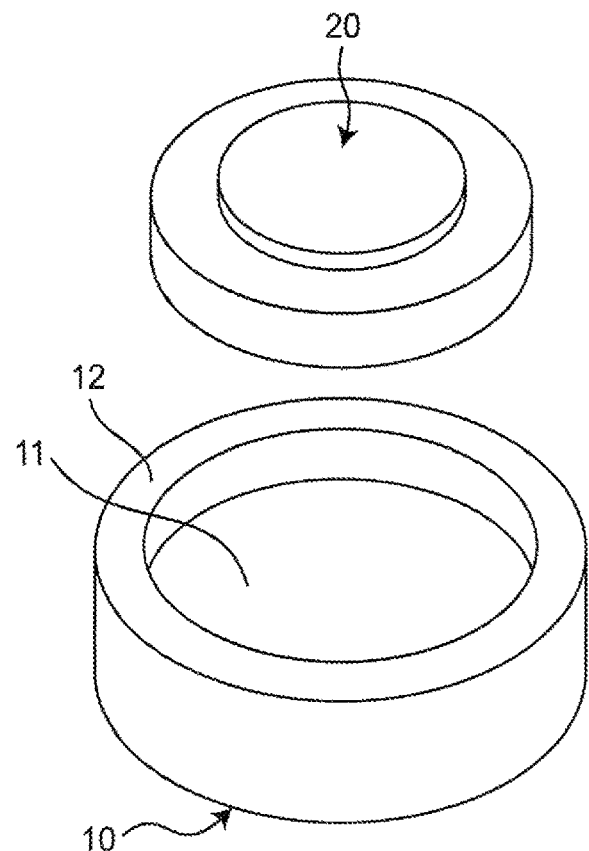
FIG. 4 It is an explanatory drawing explaining a process for producing a sputtering target of a first embodiment.

As shown in FIG. 4, a metal material is cut using a milling machine, an NC milling machine, a machining center, a lathe, an NC lathe, and the like to prepare a backing plate material 10 and a target material 20. Then, the backing plate material 10 and the target material 20 are subjected to silver plating. At this time, a top face of the base plate 11 and an inner peripheral surface of the frame part 12, and a bottom face and a side surface of the target material 20 (i.e., parts where the backing plate material 10 and the target material 20 are in contact with each other) are subjected to silver plating (plating layer 40 of FIG. 3). Preferably, the top face of the base plate 11 and the bottom face of the target material 20 are provided with silver plating. The silver plating may be provided over the entire surface of the backing plate material 10 and the target material 20 and, in this case, there is a need to remove silver plating of the top face 21 (sputtering face) of the target material 20 in the final step. Treatments such as a degreasing treatment, an acid treatment, an alkali treatment, and rinsing may be performed as a pretreatment for providing a plating layer, and these treatments can be performed by a known process. When the material of the target material 20 and the backing plate material 10 is Al or an Al alloy, a zincate treatment may be performed before the plating treatment because of a strong oxide film which is formed on the Al surface and which make it more difficult to perform a plating treatment to the surface. The zincate treatment can be performed by a known process and, for example, the materials are immersed in a zincate solution containing sodium hydroxide and zinc oxide, and preferably a zincate solution further containing a complexing agent and metal salt. The Al surface is substituted with Zn by the zincate treatment, thus enabling prevention or suppression of reoxidation of the activated surface. After the zincate treatment, immersion is performed in a zincate peeling solution such as a nitric acid to thereby peel off a zinc-substituted coating film, and the zincate treatment is performed again so as to form a finer and uniform zinc-substituted coating film. The zincate treatment may be repeated three times or more. Before providing a silver plating layer used for bonding, to prevent poor plating adhesion such as swelling and peeling of the plating layer, a strike plating treatment may be carried out using nickel, copper, silver, etc., and alloys containing these metals. For example, when the strike plating treatment is performed using copper, a copper strike plating layer can be formed by electrolytic plating in a plating solution containing copper cyanide or copper phosphate.

Figure 5:
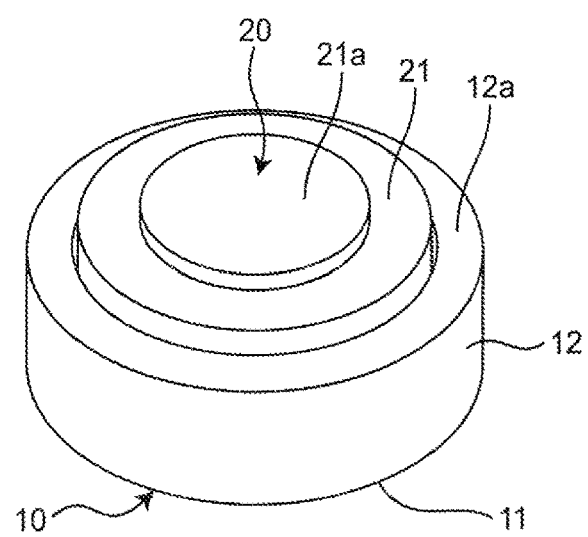
FIG. 5 It is an explanatory drawing explaining a process for producing a sputtering target of a first embodiment.
Figure 6:
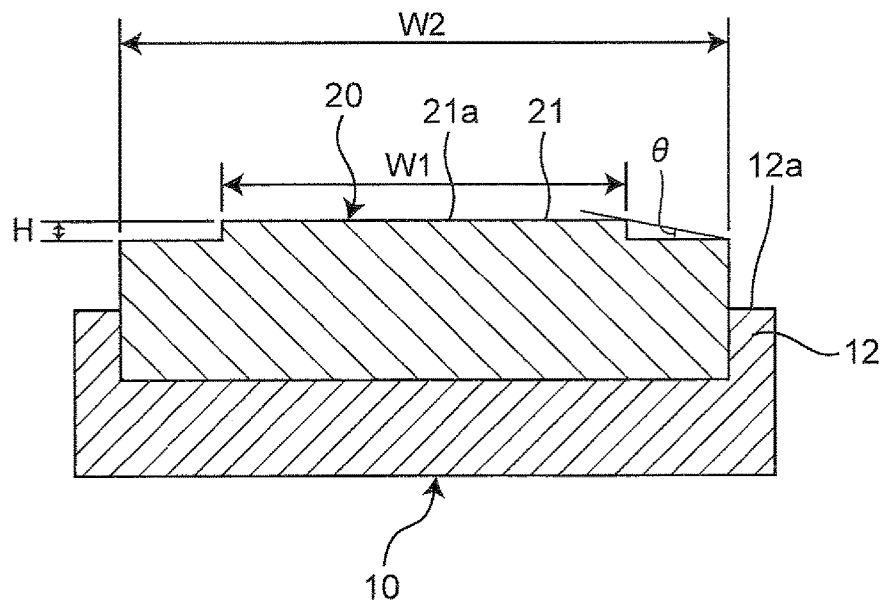
FIG. 6 It is an explanatory drawing explaining a process for producing a sputtering target of a first embodiment.

Then, as shown in FIG. 5, the target material 20 is incorporated inside the frame part 12 of the backing plate material 10. This is called an incorporating step. At this time, as shown in FIG. 6, the center part (projecting part 21a) of the top face 21 of the target material 20 projects upward from the outer peripheral part of the top face 21. The uppermost position of the target material 20 is set to be higher than the uppermost position of the frame part 12 of the backing plate material 10 in the height direction of the frame part 12 of the backing plate material 10. The uppermost position of the target material 20 is the position of the projecting part 21a formed on the top face 21 of the target material 20. The uppermost position of the frame part 12 of the backing plate material 10 is the position of the top face 12a of the frame part 12.

Figure 7:
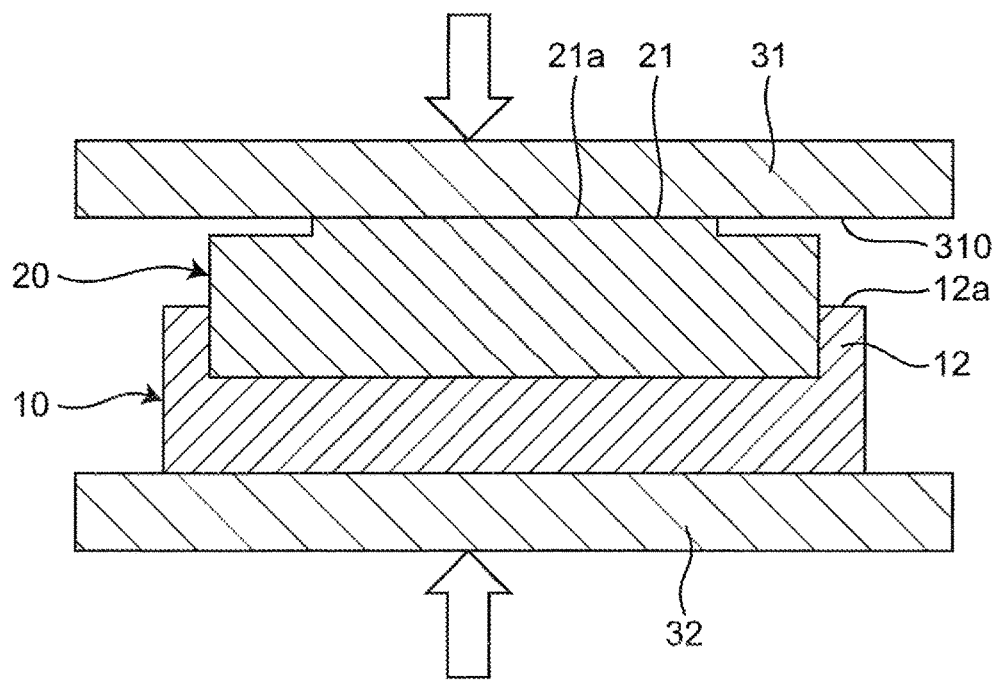
FIG. 7 It is an explanatory drawing explaining a process for producing a sputtering target of a first embodiment.

After the incorporating step, as shown in FIG. 7, the target material 20 is diffusion-bonded to the backing plate material 10. This is called a bonding step. At this time, the backing plate material 10 and the target material 20 are sandwiched from the upper and lower sides by the upper heating plate 31 and the lower heating plate 32, heated and then pressed in the vertical direction. This is called hot pressing. Namely, the backing plate material 10 and the target material 20 are bonded via the plating layer.

Figure 10:
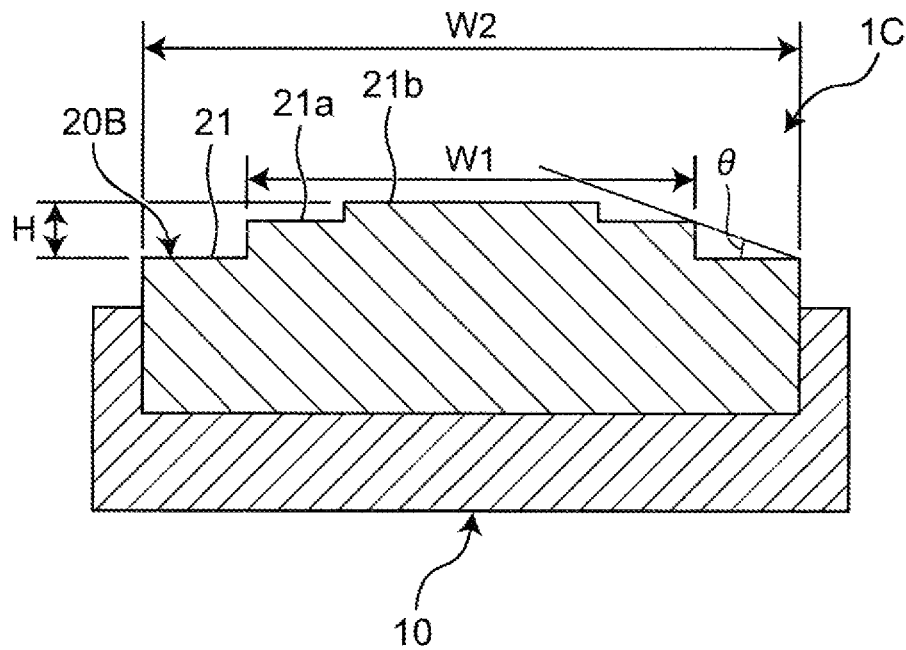
FIG. 10 It is a cross-sectional view showing a sputtering target of Examples 1 to 3.

The bonding step shown in FIG. 7 will be described more specifically. The top face 21 of the target material 20 is heated at the center part (projecting part 21a) of the face prior to the outer peripheral part of the face by a bottom face 310 of the upper hot plate 31 while pressing from above, to perform diffusion-bonding of the target material 20 to the backing plate material 10. In the step, the bottom face 310 of the upper hot plate 31 is flat, but the center part (projecting part 21a) of the top face 21 of the target material 20 projects upward from the outer peripheral part of the top face 21 so that, with a simple structure, the top face 21 of the target material 20 can be pressed at the center part (projecting part 21a) of the top face prior to the outer peripheral part of the face by the upper hot plate 31. The shape of the projecting part 21a is composed of a single ramp but may be composed of a plurality of ramps, i.e., more than two ramps as shown in FIG. 10. A top face of the projecting part 21a is flat or may have a convex curved surface. When the top face of the projecting part 21a has a convex curved surface, a region of the projecting part 21a in contact with the bottom face 310 of the upper hot plate 31 and pressed during pressing by the bottom face 310 of the upper hot plate 31 can be regarded as the center part of the top face 21 of the target material 20.

A width of the projecting part 21a usually accounts for 30% or more of a width (diameter) of the target material, and preferably 40 to 60% so as to increase the bonding strength in the center part of the target material 20. The degree of projection from the top surface 21 of the projecting part 21a can be judged by an angle, which is formed by a line segment connecting an outer peripheral end edge of the outer peripheral part of the top face 21 and an outer peripheral end edge of the projecting part 21a, and the outer peripheral part of the top face 21 in a vertical section of the target material 20. The angle formed by the above-mentioned line segment and the outer peripheral part of the top face 21 is preferably 0.050° or more, more preferably 0.050° to 0.500°, and still more preferably 0.100° to 0.300°. When the angle is in the above range, the pressure from the upper hot plate 31 can be effectively transferred to the target material 20 or the backing plate material 10 so that bonding strength can be increased. When an upper section of the projecting part 21a is composed of multiple ramps of two or more ramps, as shown in FIG. 10, the maximum angle among the angles, which is formed by the line segment connecting the outer peripheral end edge of the outer peripheral part of the top face 21 and the outer peripheral end edge of each ramp of the projecting part, and the outer peripheral part of the top face 21, may be in the above range. When the shape of the projecting part 21a is a convex curved surface, the maximum angle among the angles, formed by the line segment in contact with the convex curves surface and the outer peripheral part of the top face 21, may be in the above range.

Hot pressing can be performed using a known hot press machine. The sputtering target and the bonded body for producing a sputtering target of the present invention can be manufactured by a process including a bonding step other than those in the above embodiments. For example, in the bonding step shown in FIG. 7, when pressing the backing plate material 10 and the target material 20 in the vertical direction, only the upper hot plate 31 may be pressed downward in a state where the lower hot plate 32 is fixed. Alternatively, only the lower hot plate 32 may be pressed upward in a state where the upper hot plate 31 is fixed. The pressing direction is not necessarily required to be the vertical direction as long as an assembly composed of the backing plate material 10 and the target material 20 can be fixed so as not to interfere with bonding, and the backing plate material 10 and the target material 20 may be placed in parallel with the vertical direction and bonded by pressing in the horizontal direction. To uniformly bond without forming the unbonded portion, bonding is performed by pressing in the vertical direction. FIG. 7 shows an example of a process for installing an assembled body in which the target material 20 is incorporated inside the backing plate material 10 on the hot plate. However, the target material 20 may be placed on a top side (the top face 21 of the target material 20 is in contact with the upper hot plate 31) or may be placed on a bottom side (the top face 21 of the target material 20 is in contact with the lower hot plate 32). In this step, a surface of the hot plate that is in contact with the top face 21 of the target material 20 can be called a press surface.

An example of the conditions for hot pressing will be described below. The hot pressing step include a preheating step of preheating an assembled body in which a target material 20 is incorporated inside a backing plate material 10, and a subsequent pressing step. When the size of the target material is φ450 mm, the temperature of the hot plate during hot pressing depends on the composition of the target material, and is 200° C. to 500° C., preferably 220° C. to 400°±10° C., and more preferably 230° C. to 330° C. Preferably, preheat is conducted in such a manner that the temperature of the target material is ±20° C., and preferably ±10° C., of the temperature of the hot plate. The temperature of the hot plate during preheating is 190° C. to 500° C., preferably 210° C. to 400° C., and more preferably 220° C. to 370° C., and the preheating time is 5 minutes or more, preferably 5 minutes to 60 minutes, and more preferably 10 minutes to 30 minutes. An example of the preheating process includes a process which include a step of placing, on the lower hot plate, the target material 20 incorporated inside the backing plate material 10, and statically placing the upper hot plate in a state of being close to the top face of the target material of the assembly, i.e. immediately above the top face 21 of the target material of the assembly, a position which is preferably from 0 mm to 50 mm, more preferably from 10 mm to 40 mm, and still more preferably from 15 mm to 30 mm, away from the top face. The pressure to be applied to the assembled body in which the target material 20 is incorporated inside the backing plate material 10 during hot pressing is 8 MPa or more, preferably from 10 MPa to 80 MPa, and more preferably 25 MPa to 70 MPa, and the pressing time is 10 minutes or more, preferably from 10 minutes to 60 minutes, and more preferably from 20 minutes to 40 minutes. When the size of the target material increases, the pressure to be applied also increases.

The material constituting the upper hot plate 31 and the lower hot plate 32 is preferably a high strength alloy such as an alloy steel or a carbon steel. For example, chromium molybdenum steels such as SCM430 and SCM440, stainless steels such as SUS304 and SUS316, and carbon steels such as S45C and S60C can be used.

There is no particular limitation on the shape of the upper hot plate 31 and the lower hot plate 32, and the surface, against which the target material is pressed, may have a circular, rectangular, square quadrangular, or other polygonal shape. The size of the upper hot plate 31 and the lower hot plate 32 may be any size as long as it enables pressing the entire target material 20, and the size may be determined in accordance with the size of the target material 20. For example, to press a target material having a size of φ450 mm and a backing plate material having a size of φ550 mm, the size of 1,000 mm×1,000 mm×t100 mm can be used in the case of a square hot plate. The size of the hot plate on the side in contact with the backing plate material 10 may be substantially equal to or larger than the size of the backing plate material. Regarding the size of the hot plate on the side in contact with the upper surface 21 of the target material 20, the length of one side of the pressing surface is 0.8 to 5 times, preferably 1 to 3 times, and more preferably 1.2 to 2.5 times the size of the target material.

According to a first embodiment, a sputtering target 1 as shown in FIG. 2 is produced. In the sputtering target 1, the bonding strength between the center part of the bottom face of the target material 20 and the backing plate material 10 becomes 7 kg/mm$^2$ or more so that bonding strength can be increase. The bonding strength between the center part of the target material 20 and the backing plate material 10 means the strength of the bonding part with the backing plate material 10 in a region where the top face 21 of the target material 20 can be pressed at the center part (that means a region which is in contact with the bottom face 310 and pressed when the projecting part 21 or the top face of the projecting part 21 is a convex curved surface) to be initially by the bottom face 310 is projected against the bottom face of the target material 20. The bonding strength between the center part of the target material 20 and the backing plate 10 according to the process of the present application is usually 15 kg/mm$^2$ or less. At least a part of the frame part 12 of the backing plate material 10 may be removed by finish cutting after bonding the target material 20 to the backing plate material 10, and the top face 21 or the projecting part 21a of the target material 20 may be smoothed by polishing. Preferably, a milling machine, an NC milling machine, a machining center, a lathe, an NC lathe, and the like can be used for finish cutting of the sputtering target 1.

According to the process for producing the sputtering target 1, the top face 21 of the target material 20 is heated at the center part of the face prior to the outer peripheral part of the face by the press surface 310 of the upper hot plate 31 while pressing from above to thereby perform diffusion-bonding of the target material 20 to the backing plate material 10.

According to a conventional process, repetition of bonding by the hot press sometimes makes the center part of the upper hot plate 31 slightly deformed and recessed. Since the target material 20 is fit inside the frame part 12 of the backing plate material 21, followed by being pressed, the pressure at bonding tends to concentrate on the outer peripheral part of the target material 20, so that the bonding strength cannot sufficiently be increased at the center part of the target material 20.

According to the present embodiment, the top face 21 of the target material 20 can be loaded at the center part of the face by the upper hot plate 31 so that bonding strength of the target material 20 to the backing plate material 10 can be increased. Particularly, the bonding strength can be increased at the center part of the target material 20 where only low bonding strength could be obtained by a conventional process.

According to the first embodiment, the top face 21 of the target material 20 can be loaded in order from the center part to the outer peripheral part by the upper hot plate 31, to thereby remove air existing between the top face of the backing plate material 10 and the bottom face of the target material 20 from the center part to the outer peripheral part. Therefore, a gap can be eliminated between the top face of the backing plate material 10 and the bottom face of the target material 20, thus enabling an increase in bonding strength of the target material 20 to the backing plate material 10.

According to the first embodiment, owing to use of the hot press, reducing the pressure required for bonding, shortening the time required for bonding and reducing the cost required for bonding can be achieved as compared with the hot isotropic pressing process.

According to the first embodiment, even when the target material 20 is incorporated inside the frame part 12 of the backing plate material 10, the top face 21 of the target material 20 can be loaded even at the center part of the face by the upper hot plate 31 to thereby increase bonding strength of the target material 20 to the backing plate material 10.

According to the first embodiment, the backing plate material 10 and the target material 20 are bonded together through the plating layer 40 so that the backing plate material 10 and the target material 20 can be certainly bonded together even at a temperature lower than a temperature in the case where the plating layer 40 is not provided, for example, 200° C. to 500° C., preferably 220° C. to 400° C., and more preferably 230° C. to 330° C. with bonding by pressing from the uniaxial direction, preferably from above (uniaxial press). Particularly, when the target material 20 is made of a relatively low melting metal such as Al and an Al alloy, bonding can be achieved at the above-mentioned low temperature via the plating layer to thereby suppress deterioration (change in crystallinity) of the target material 20.

According to the first embodiment, the top face 11a of the base plate 11 of the backing plate material 10 and the bottom face 20a of the target material 20 are preferably bonded together through the plating layer 40. By hot pressing, a force can be transmitted to the top face 11a of the backing plate material 10 and the bottom face 20a of the target material 20 without resistance and adhesion at the bonding surface can be increased, leading to an increase in bonding strength. Since the hot pressing is uniaxial pressing, there is no need to apply a force that enables bonding to a side surface of the target material 20 and an inner peripheral surface of the frame part 12 of the backing plate material 10, and there is no need to bond the side surface of the target material 20 to the backing plate material 10.

If the side surface of the target material 20 is not bonded to the backing plate 10, the frame part of the backing plate can be cut at a root thereof in a circumference direction to thereby reduce cutting time in the case of performing finishing to obtain a sputtering target having a backing plate shape in which the bonding surface side or the frame part remains slightly flat.

(Second Embodiment)

Figure 8:
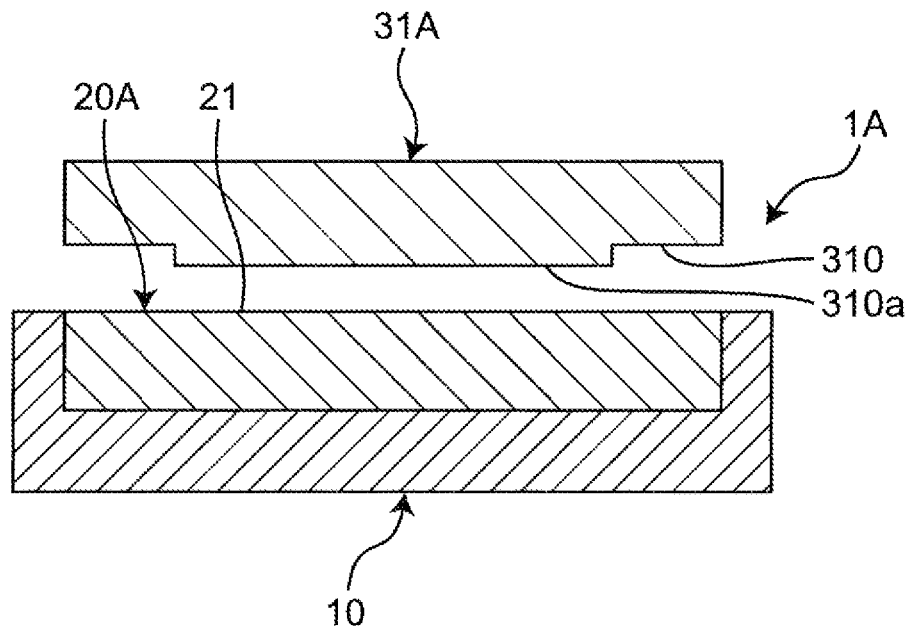
FIG. 8 It is a cross-sectional view of a sputtering target of a second embodiment.

FIG. 8 is a cross-sectional view showing the second embodiment of a process for producing a sputtering target of the present invention. The second embodiment differs from the first embodiment in a shape of a target material and an upper hot plate. This difference in elements will be described below.

As shown in FIG. 8, in a sputtering target 1A before bonding, a top face 21 of a target material 20A has a flat surface. A center part of a press surface 310 of an upper hot plate 31A projects downward from an outer peripheral part of the press surface 310. In other words, the center part of the press surface 310 has a projecting part 310a projecting downwardly. A shape of the projecting part 310a is composed of a single ramp but may be composed of multiple ramps. The press surface of the projecting part 310a is flat but may have a convex curved surface.

A width of the projecting part 310a usually accounts for 30% or more of a width (diameter) of the target material, and preferably 40 to 60% so as to increase the bonding strength in the center part of the target material 20.

In the embodiment shown in FIG. 8, the center part of the press surface 310 of the upper hot plate 31A projects downward from the outer peripheral part of the press surface 310 so that the top face 21 of the target material 20A can be pressed at the center part of the face prior to the outer peripheral part of the face during bonding the upper hot plate 31A with a simple procedure. The second embodiment has an element identical to the first embodiment except for the above difference.

(Third Embodiment)

Figure 9:
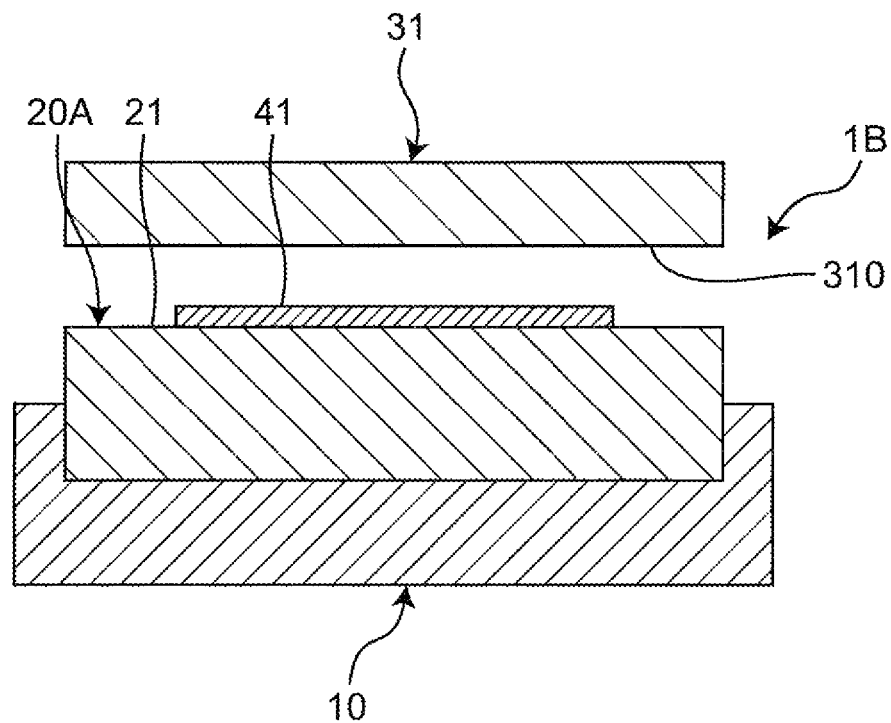
FIG. 9 It is a cross-sectional view of a sputtering target of a third embodiment.

FIG. 9 is a cross-sectional view showing a third embodiment of a process for producing a sputtering target of the present invention. The third embodiment differs from the first embodiment in a shape of a target material. The difference in an element will be described below.

As shown in FIG. 9, in a sputtering target 1B before bonding, the top face 21 of the target material 20A is flat. A center part of the top face 21 of the target material is provided with a projecting member 41 projecting upward from the outer peripheral part of the top face 21 of the target material 20A. The projecting member 41 is composed of, for example, a heat-resistant sheet made of a resin such as polyimide or a metal sheet free from diffusion-bonding. The projecting member 41 is composed of a single sheet but may be composed of multiple sheets each having a different diameter.

A width of the projecting member 41 usually accounts for 30% or more of a width (diameter) of a target material, and preferably 40 to 60% so as to increase the bonding strength in the center part of a target material 20A. The degree of projection from the top surface 21 of the target material 20A of the projecting member 41 can be judged by an angle in a vertical section of the target material 20A, which angle is formed by a line segment connecting an outer peripheral end edge of the outer peripheral part of the top face 21 and an outer peripheral end edge of the projecting member 41, and the outer peripheral part of the top face 21. The angle formed by the above-mentioned line segment and the outer peripheral part of the top face 21 is preferably 0.050° or more, more preferably 0.05° to 0.50°, and still more preferably 0.10° to 0.30°. When the angle is in the above range, the pressure from the upper hot plate 31 can effectively be transferred to the target material 20A and the backing plate material 10, to thereby increase bonding strength. When the projecting material 41 is composed of multiple different sheets, the maximum angle among the angles, which is formed by the line segment connecting the outer peripheral end edge of the outer peripheral part of the top face 21 and the outer peripheral end edge of each projecting member 41, and the outer peripheral part of the top face 21, may be in the above range.

In the embodiment shown in FIG. 9, the projecting member 41 projecting upward from the outer peripheral part of the top face 21 is provided at the center part of the top face 21 of the target material 20A, so that the center part of the top face 21 of the target material 20A can be pressed at the center part of the face prior to the outer peripheral part of the top face 21 of the target material 20A during bonding by the upper hot plate 31A, with a simple procedure. The third embodiment has elements identical to the first embodiment except for the above difference.

The present invention is not limited to the above embodiments, but design can be changed without departing from the spirit and scope of the present invention. For example, features of the first to third embodiments may be used in combination in various ways.

In the above embodiment, the backing plate material includes the frame part, which may be omitted or may be removed by finish-cutting after diffusion-bonding.

Further, in the embodiment, the target material 20 is pressed by the upper hot plate for hot pressing in order from the center part to the outer peripheral part of the target material 20 to thereby deform in a contact part with the backing plate material 10 from the center part to the outer peripheral part. Therefore, inside the frame part 12, the bonding strength with the backing plate material 10 tends to be slightly higher in the outer peripheral part than the center part of the target material 20 due to a deformation force from the center part and pressure applied from the upper hot plate. Usually, a difference in the bonding strength between the outer peripheral part and the center part is 0.1 kg/mm$^2$ or more, and preferably from 0.1 kg/mm$^2$ to 3 kg/mm$^2$. When the frame part 12 is removed by finish cutting after bonding, defects might occur at a bonding surface between the backing plate material 10 and the frame part 12 due to a force applied to the frame part 12 and the outer peripheral part of the target material 20 during cutting. However, when a difference in the bonding strength between the outer peripheral part and the center part is in the above range, the bonding strength of the outer peripheral part is slightly higher than that of the center part to thereby suppress the occurrence of defects in the bonding surface during finish cutting.

EXAMPLES

The present invention will be described by way of Examples 1 to 4 and Comparative Example.

The sputtering targets of Examples 1 to 3 are sputtering targets shown in FIG. 6. The sputtering target before bonding includes the first projecting part 21*a* in the center part of the top face 21 of the target material 20.

The maximum width W1 of the projecting part 21*a* is a diameter of the first projecting part 21*a*. The maximum height H of the projecting part 21*a* is a height from the outer peripheral part of the top face 21 to the first projecting part 21*a*. The maximum angle θ of the projecting part 21*a* is the maximum angle among the angles, which is formed by the line segment connecting the outer peripheral end edge of the outer peripheral part of the top face 21 and the outer peripheral end edge of the first projecting part 21*a* and the outer peripheral part of the top face 21 in a vertical cross section of the target material 20B. A target width W2 is a diameter of the target material 20.

In Example 1, the maximum width W1 was 220 mm, the maximum height H was 0.3 mm, the maximum angle θ was 0.150°, and a ratio of the maximum width W1 to the target width W2 was 49%. In Example 2, the maximum width W1 was 260 mm, the maximum height H was 0.3 mm, an angle θ was 0.180°, and a ratio of the maximum width W1 to the target width W2 was 58%. In Example 3, the maximum width W1 was 180 mm, the maximum height H was 0.3 mm, an angle θ was 0.130°, and a ratio of the maximum width W1 to the target width W2 was 40%.

Figure 11:
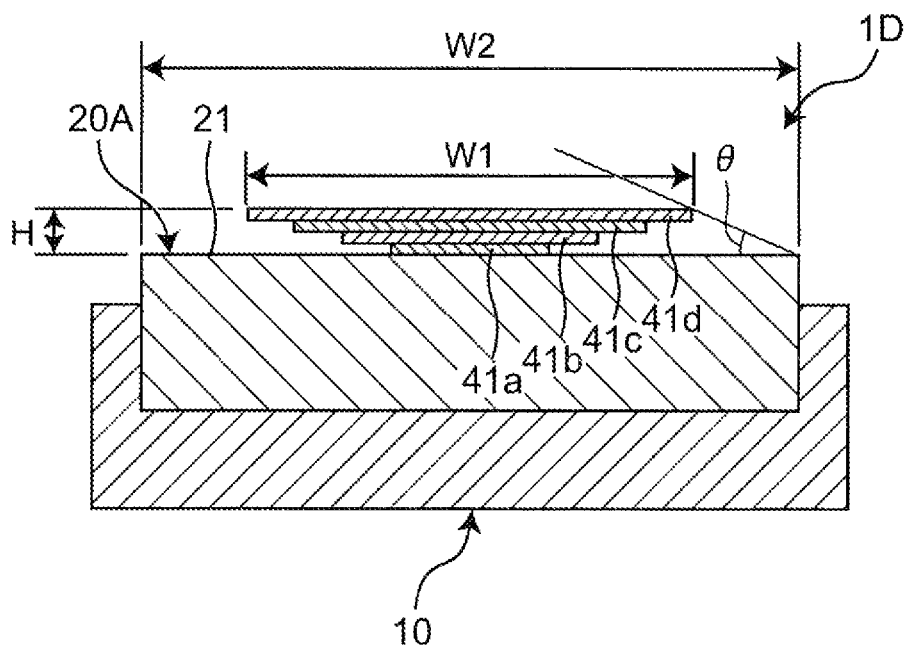
FIG. 11 It is a cross sectional view showing a sputtering target of Example 4.

A sputtering target of Example 4 is a sputtering target 1D shown in FIG. 11. The sputtering target 1D before bonding was provided with the first to the fourth members 41*a* to 41*d* in this order in the center part of the top face 21 of the target material 20A. Each diameter of the first to the fourth members 41*a* to 41*d* increased in order. The diameter of the first projecting member 41*a* was 30 mm, the diameter of the second projecting member 41*b* was 50 mm, the diameter of the third projecting member 41*c* was 100 mm, and the diameter of the fourth projecting member 41*d* was 260 mm. Each thickness of the first to the fourth projecting members 41*a* to 41*d* was 0.1 mm.

The maximum width W1 of the projecting members 41*a* to 41*d* is a diameter of the fourth projecting member 41*d*. The maximum height H of the projecting members 41*a* to 41*d* is a height from the outer peripheral part of the top face 21 to the fourth projecting member 41*d*. The maximum angle θ of the projecting members 41*a* to 41*d* indicates the maximum angle among the angles, which is formed by a line segment connecting the outer peripheral end edge of the outer peripheral part of the top face 21 and an outer peripheral end edge of each of the fourth projecting members 41*a* to 41*d* and the outer peripheral part of the top face 21 in a vertical section of the target material 20A. The target width W2 is a diameter of a target material 20B.

In Example 4, the maximum width W1 was 260 mm, the maximum height H was 0.4 mm, the maximum angle θ was 0.240°, and a ratio of the maximum width W1 to the target width W2 was 58%.

In a sputtering target of Comparative Example, a target material had a flat top face, and there are neither projecting parts 21*a*, 21*b* shown in FIG. 10 nor projecting members 41*a* to 41*d* shown in FIG. 11.

In Examples 1 to 4 and Comparative Example, the top face of the target material was pressed by the upper hot plate 31 having a flat press surface 310 (see FIG. 7), thereby diffusion-bonding the target material to the backing plate material. Al-0.5% Cu having a size of φ450 mm×t14.5 mm was used as the target material, and a A2024 alloy having a size of φ550 mm×t25 mm provided with a recess part having a size of φ450.3 mm×12 mm in depth was used as the backing plate material. A polyimide film was used as the projecting members 41*a* to 41*d* of Example 4. A silver plating layer was provided between the target material and the backing plate material, followed by diffusion-bonding under the conditions of a pressure of 56 MPa, a bonding temperature of 270° C., a preheating time of 10 minutes, and a pressing time of 30 minutes. The silver plating treatment was applied to bonding surface side of the target material and the backing plate material, followed by a zincate treatment and a copper strike plating and further formation of a silver plating layer having a thickness of about 10 μm on the bonding surfaces of both target material and backing plate material by an electrolytic plating process. In hot pressing, a hot press machine was used. The hot press machine was a machine (model number: MSF-1000HP) manufactured by MORI IRON WORKS CO., LTD. equipped with an upper hot plate and a lower hot plate, and each made of SCM440 and has a size of 1,000 mm×1,000 mm×t100 mm. An assembled body composed of a backing plate material and a target material placed on a lower hot plate was heated while moving an upper hot plate in a vertically downward direction and pressing from above. The bonding strength was measured using a test piece sampled from a sputtering target obtained by the diffusion-bonding. A section having a size of 10 mm in width×15 mm in depth×23 mm in height was cut out from the sputtering target and then a neck was formed in a vertical direction with the bonding surface as the center such that the section has a size of 4 mm in width×15 mm in depth (an area of the bonding has a size of 4 mm in width×15 mm in depth) to obtain a tensile test piece for measuring the bonding strength. Using a universal testing machine (UH-500kNIR, manufactured by Shimadzu Corporation), the bonding strength was measured by applying a load in a direction perpendicular to the bonding surface. The results are shown in Table 1. The bonding strength of the center part mentioned in Table 1 was determined using the tensile test piece cut out from the inside of the maximum width W1 in the projecting part of the top face of the target material, while the bonding strength of the outer peripheral part mentioned in Table 1 was determined using the tensile test piece cut out from the outside of the maximum width W1 in the projecting part of the top face of the target material.

In the sputtering target obtained by diffusion-bonding in Examples 1 to 4, the top face of the target material was smoothened by removing and shaving off the frame part of the backing plate material by finish cutting using an NC milling machine.

TABLE 1

| | Maximum width W1 (nm) | Maximum height H (mm) | Ratio of maximum width W1/target width W2 (%) | Maximum angle θ (°) | Bonding strength kg/mm² | | Thickness of plating layer (μm) | |
|---|---|---|---|---|---|---|---|---|
| | | | | | Center part | Outer peripheral part | Center part | Outer peripheral part |
| Comparative Example | — | — | 0 | 0 | 0 | 14.6 | 28.0 | 30.2 |

TABLE 1-continued

| | Maximum width W1 (nm) | Maximum height H (mm) | Ratio of maximum width W1/target width W2 (%) | Maximum angle θ (°) | Bonding strength kg/mm² | | Thickness of plating layer (μm) | |
|---|---|---|---|---|---|---|---|---|
| | | | | | Center part | Outer peripheral part | Center part | Outer peripheral part |
| Example 1 | 220 | 0.3 | 49 | 0.15 | 8.3 | 9.5 | 12.6 | 15.2 |
| Example 2 | 260 | 0.3 | 58 | 0.18 | 9.7 | 9.9 | 15.6 | 16.1 |
| Example 3 | 180 | 0.3 | 40 | 0.13 | 9.5 | 11.2 | 15.2 | 19.6 |
| Example 4 | 260 | 0.4 | 58 | 0.24 | 7.4 | 10.3 | 11.0 | 17.1 |

As is apparent from Table 1, the bonding strength of the center part between the target material and the backing plate material was 0 [kg/mm²] in Comparative Example, while 7.4 to 9.7 [kg/mm²] in Examples 1 to 4. In Examples 1 to 4, there was no problem in the bonding strength between the target material and the outer peripheral part of the backing plate material. Therefore, the strength of the outer peripheral part was appropriately adjusted to increase the bonding strength of the center part in Examples 1 to 4, as compared with Comparative Example. As mentioned above, the entire bonding strength was increased by pressing the top face of the target material by the upper hot plate at the center part of the face prior to the outer peripheral part of the face.

In the sputtering targets obtained in Examples 1 to 4, finish cutting was performed to remove the frame part of the backing plate material and polish the top face of the target material. After finishing, problems such as defects in the bonding part between the target material and the backing plate were not confirmed even in the outer peripheral part to which a strong force would be applied.

Table 1 shows a thickness (total thickness of a plating layer between the target material and the backing plate material in the diffusion-bonded sputtering target) of the plating layer of Examples 1 to 4 and Comparative Example. In Examples, the plating layer is a layer containing Ag as a main component. As shown in Table 1, in Examples 1 to 4, there is a relationship between the thickness of the plating layer and the bonding strength, and it is apparent that the bonding strength becomes higher as the plating layer becomes thicker. Meanwhile, in Comparative Example, satisfactory pressing cannot be performed because of a flat top face of the target material, so that the bonding strength is 0 kg/mm², and there is no relationship with the thickness of the plating layer.

Description will be made of a mechanism of a change of bonding strength according to the thickness of the plating layer. It is considered that, in the vicinity of the bonding surface between the target material and the plating layer, metal contained in the target material and metal contained in the underlaying layer of the plating layer diffuse to form a plating layer having high impurity concentration. Therefore, it is considered that an increase in the thickness of the plating layer leads to an increase in purity of Ag in the center part of the plating layer and a decrease in amount of impurities in the vicinity of the bonding surface, thus increasing the bonding strength. The tension strength of Al-0.5% Cu itself is about 7 kg/mm² and the tension strength of Ag itself of 4N is about 16 kg/mm². The thickness of the plating layer may be increased, but an influence by physical properties of Ag is saturated. Since Ag is expensive metal and excessive thickness leads to an increase in cost.

Figure 12:
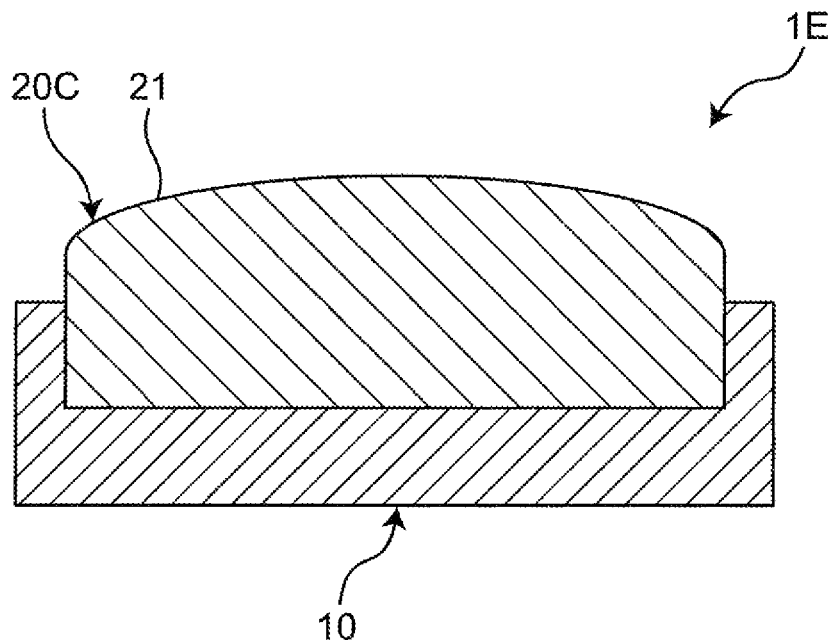
FIG. 12 It is a cross-sectional view showing another mode of a sputtering target of the present invention.
Figure 13:
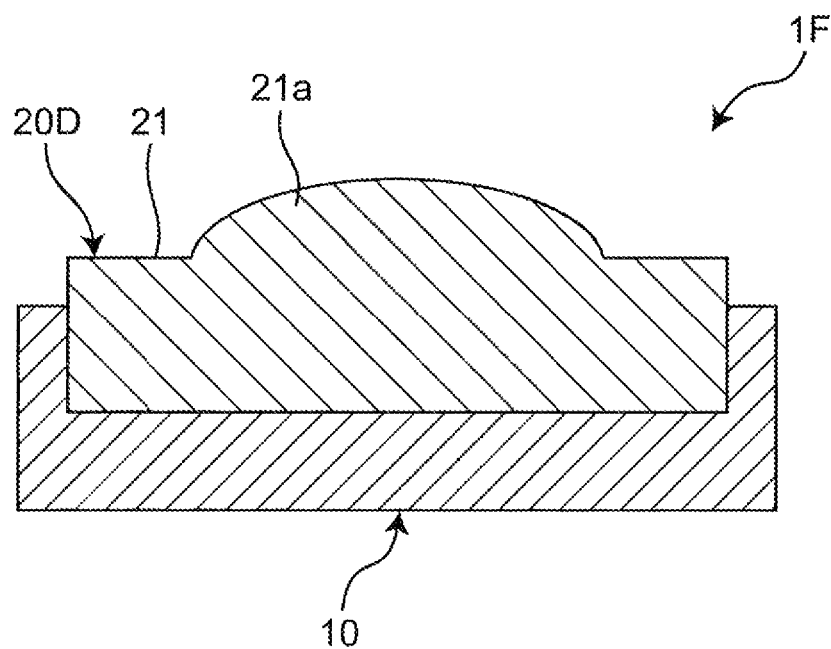
FIG. 13 It is a cross sectional view showing a further mode of a sputtering target of the present invention.

In the above embodiments, the projecting part of the top face of the target material has a ramp shape but may have other shapes. For example, as shown in FIG. 12, the shape of a top face 21 of a target material 20C may be a curved surface in which the center part projects upward from an outer peripheral part. As shown in FIG. 13, a projecting part 21a of a top face 21 of a target material 20D may have a shape of a curved surface in which the center part projects upward from an outer peripheral part.

Likewise, the bottom face of the upper hot plate may also have a shape of a curved surface in which center part projects upward from the outer peripheral part. The shape of the projecting part of the bottom face of the upper hot plate may also have a curved surface in which the center part projects upward from the outer peripheral part.

When the press surface of the upper hot plate has shape of a curved surface, the dimension of the press surface of the upper hot plate may be the dimension shown in FIG. 14. FIG. 14 shows a positional coordinate in which the press surface of the upper hot plate is divided into A to E in a lateral direction and into 1 to 5 in a longitudinal direction, and shows the dimension of the positional coordinate. A unit of the dimension is mm and the positive value of the dimension indicates a projecting state. The length for dividing in the longitudinal direction and the lateral direction is 200 mm. As is apparent from FIG. 14, the center of the press surface of the upper hot plate (position of "C" in the lateral direction and the position of "3" in the longitudinal direction) has the uppermost height, e.g., +0.4 mm, and the height gradually decreases toward the outer periphery of the press surface of the upper hot plate.

DESCRIPTION OF REFERENCE NUMERALS 1, 1A to 1F Sputtering target
10 Backing plate material
11 Base plate
11a Top face
12 Frame part
12a Top face
20, 20A to 20D Target material
20a Bottom face
21 Top face
21a Projecting part
21b Projecting part
31, 31A Upper hot plate
310 Bottom face (press surface)
310a Projecting part
32 Lower hot plate
40 Plating layer
41 Projecting member
41a to 41d First to fourth projecting member

The invention claimed is:
1. A process for producing a sputtering target in which a target material is diffusion-bonded to a top face of a backing plate material, which process comprises heating the top face of the target material by a hot plate at a center part prior to an outer peripheral part of the top face while pressing from above to perform diffusion-bonding of the target material to the backing plate material, said target material having hardness smaller than the backing plate material.

2. The process for producing a sputtering target according to claim 1, wherein the center part of the top face of the target material projects upward from the outer peripheral part of the top face.

3. The process for producing a sputtering target according to claim 1, wherein, in the hot plate, the center part of a press surface in contact with the target material during pressing projects downward from an outer peripheral part of the press surface.

4. The process for producing a sputtering target according to claim 1, wherein the center part of the top face of the target material is provided with a projecting member projecting upward from the outer peripheral part of the top face of the target material.

5. The process for producing a sputtering target according to claim 1, further comprising: incorporating the target material inside a frame part of a backing plate material having an annular frame part, followed by heating the top face of the target material by a hot plate at a center part prior to an outer peripheral part of the top face while pressing from above to perform diffusion-bonding of the target material to the backing plate material.

6. A process for producing a sputtering target in which a target material is diffusion-bonded to a top face of a backing plate material, which process comprises heating the target material by a hot plate at a center part of an opposite face to a face in contact with the backing plate material prior to an outer peripheral part of the opposite face while pressing from a uniaxial direction to perform diffusion-bonding of the target material to the backing plate material, said target material having hardness smaller than the backing plate material.

7. The process for producing a sputtering target according to claim 6, wherein the center part of the opposite face of the target material projects upward from the outer peripheral part of the opposite face.

8. The process for producing a sputtering target according to claim 6, wherein, in the hot plate, the center part of a press surface in contact with the target material during pressing projects downward from an outer peripheral part of the press surface.

9. The process for producing a sputtering target according to claim 6, wherein the center part of the opposite face of the target material is provided with a projecting member projecting upward from the outer peripheral part of the opposite face of the target material to a face opposite to a face in contact with the backing plate.

10. The process for producing a sputtering target according to claim 6, further comprising: incorporating the target material inside a frame part of a backing plate material having an annular frame part, followed by heating the target material by the hot plate at the center part of an opposite face to a face in contact with the backing plate material prior to the outer peripheral part of the opposite face while pressing from the uniaxial direction to perform diffusion-bonding of the target material to the backing plate material.

* * * * *